(12) United States Patent
Janzen (10) Patent No.: US 7,352,602 B2
(45) Date of Patent: Apr. 1, 2008

(54) CONFIGURABLE INPUTS AND OUTPUTS FOR MEMORY STACKING SYSTEM AND METHOD

(75) Inventor: Jeffery W. Janzen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/323,530

(22) Filed: Dec. 30, 2005

(65) Prior Publication Data

US 2007/0153588 A1    Jul. 5, 2007

(51) Int. Cl.
*G11C 5/06* (2006.01)
(52) U.S. Cl. .................. 365/63; 326/41; 326/47; 257/686; 257/698; 438/109; 174/524; 361/790
(58) Field of Classification Search .............. 365/63; 326/47, 41; 257/686, 698; 438/109; 174/524; 361/790
See application file for complete search history.

(56) References Cited

U.S. PATENT DOCUMENTS

| | | | | |
|---|---|---|---|---|
| 4,686,691 A | * | 8/1987 | Deal et al. ............... 377/54 |
| 4,862,249 A | * | 8/1989 | Carlson ............... 257/668 |
| 5,233,539 A | * | 8/1993 | Agrawal et al. ........... 716/16 |
| 5,332,922 A | * | 7/1994 | Oguchi et al. ............ 257/723 |
| 5,399,898 A | * | 3/1995 | Rostoker ............... 257/499 |
| 5,444,637 A | * | 8/1995 | Smesny et al. ........... 702/127 |
| 5,572,148 A | * | 11/1996 | Lytle et al. ............. 326/41 |
| 5,705,938 A | * | 1/1998 | Kean ............... 326/39 |
| 5,821,624 A | * | 10/1998 | Pasch ............... 257/776 |
| 5,837,566 A | * | 11/1998 | Pedersen et al. ........... 438/109 |
| 5,847,561 A | * | 12/1998 | Whetsel ............... 324/158.1 |
| 5,973,396 A | * | 10/1999 | Farnworth ............... 257/698 |
| 6,049,223 A | * | 4/2000 | Lytle et al. ............. 326/40 |
| 6,180,881 B1 | * | 1/2001 | Isaak ............... 174/524 |
| 6,417,695 B1 | * | 7/2002 | Duesman ............... 326/47 |
| 6,429,029 B1 | * | 8/2002 | Eldridge et al. ........... 438/14 |
| 6,542,376 B1 | * | 4/2003 | Watson ............... 361/775 |
| 6,762,620 B2 | * | 7/2004 | Jang et al. ............... 326/30 |
| 6,917,219 B2 | * | 7/2005 | New ............... 326/41 |
| 6,940,158 B2 | * | 9/2005 | Haba et al. ............. 257/686 |
| 6,952,573 B2 | * | 10/2005 | Schucker et al. ........... 455/333 |
| 6,971,045 B1 | * | 11/2005 | Deb et al. ............... 714/30 |
| 7,046,071 B1 | * | 5/2006 | Conn et al. ............. 327/407 |
| 2003/0062612 A1 | | 4/2003 | Matsuo et al. |
| 2005/0162946 A1 | | 7/2005 | Koide |

FOREIGN PATENT DOCUMENTS

EP    1187209 A    3/2002

OTHER PUBLICATIONS

Chylak et al.; Packaging Challenges and Solutions for Multi-Stack Die Applications; SEMICON West 2002.

* cited by examiner

*Primary Examiner*—Viet Q. Nguyen
(74) *Attorney, Agent, or Firm*—Fletcher Yoder (57) ABSTRACT

Embodiments of the present invention relate to configurable inputs and/or outputs for memory and memory stacking applications. More specifically, embodiments of the present invention include memory devices that include a die having a circuit configured for enablement by a particular signal, an input pin configured to receive the particular signal, and a path selector configured to selectively designate a signal path to the circuit from the input pin.

25 Claims, 9 Drawing Sheets

CONFIGURABLE INPUTS AND OUTPUTS FOR MEMORY STACKING SYSTEM AND METHOD

BACKGROUND OF THE INVENTION

1. Field of the Invention

The present invention relates generally to memory devices having stacked die configurations with configurable inputs and outputs (I/O). Specific embodiments relate to stacked die configurations without requiring redistribution layers (RDLs) to allow through wafer interconnects (TWIs) or edge bonding. Indeed, embodiments of the present invention relate to die that incorporate path selectors, which enable configuration of each die for a particular stacking requirement.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Processing speeds, system flexibility, and size constraints are typically considered by design engineers tasked with developing computer systems and system components. Computer systems typically include a plurality of memory devices which may be used to store programs and data and which may be accessible to other system components such as processors or peripheral devices. Typically, memory devices are grouped together to form memory modules such as dual-inline memory modules (DIMMs). Computer systems may incorporate numerous modules to increase the storage capacity of the system.

Die stacking has recently emerged as a powerful tool for satisfying requirements for increased memory storage capacity within restricted packaging space. Die stacking includes the process of mounting multiple chips on top of one another within a single semiconductor package. Packages having a number of vertically stacked chips or die in a single package (i.e., die stacking) advantageously increase the amount of memory that can be located within a given footprint on the substrate or printed circuit board on which the die stack is arranged. Further, die stacking may enable shorter routing interconnects from chip to chip, thus increasing signal speeds between chips, reducing noise, and reducing cross-talk. Another benefit of die stacking is that surface-mount to printed circuit board assembly is simplified because fewer components are required to be placed on the printed circuit board.

As processing demands and storage capacity continue to increase, while system size continues to decrease, die stacking is becoming increasingly useful for different memory configurations. For example, requirements for dynamic random access memory (DRAM) configurations can make it desirable or even necessary to stack die to increase density or to increase I/O widths. Current stacking techniques generally require inclusion of a redistribution layer (RDL) on each DRAM to allow through wafer interconnect (TWI) or edge bonding. It should be noted that inclusion of such an RDL adds costs. Additionally, inclusion of an RDL generally requires uniquely configured die to be used within a die stack for certain stack elements. Indeed, to accommodate stacking requirements for each particular die, each layer of a die stack will typically have a different RDL configuration.

Embodiments of the present invention may address one or more of the problems set forth above.

BRIEF SUMMARY

Techniques for providing and implementing configurable I/O in stacked die are provided. Specifically, embodiments of the present technique include making input signals in stacked die configurable using path selectors, which can be set as desired for a particular stacking requirement. For example, path selectors may be coupled with TWIs and enabled to accommodate a stacking requirement for a particular die stack such that each of the die in the stack receives the correct control signals. The path selectors may be enabled using a path selector control circuit that designates one of multiple signals to establish a signal path (e.g., via a multiplexer). It should be noted that I/O signals can be configurable between bytes to allow wide I/O configurations.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
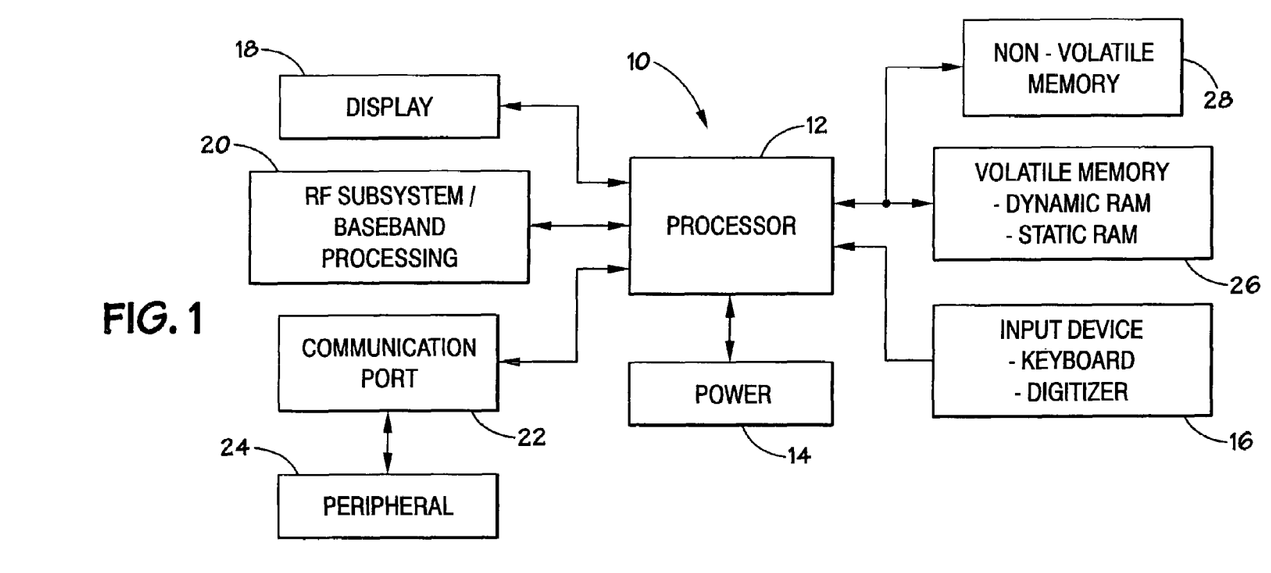
FIG. 1 illustrates a block diagram of an exemplary processor-based system.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based system, one or more processors 12, such as microprocessor, control the processing of system functions and requests in the system 10.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be couple to the processor 12. The RF sub-system/baseband processor 20 may include an antenna that is coupled to an RF receiver and to an RF transmitter (not shown). One or more communication ports 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The memory is operably coupled to the processor 12 to store and facilitate execution of various programs. For instance, the processor 12 may be coupled to the volatile memory 26 which may include DRAM and/or static random access memory (SRAM). The volatile memory 26 is typically quite large so that it can store dynamically loaded applications and data. As described further below, the volatile memory 26 may be configured in a stacked orientation in accordance with embodiments of the present invention.

The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
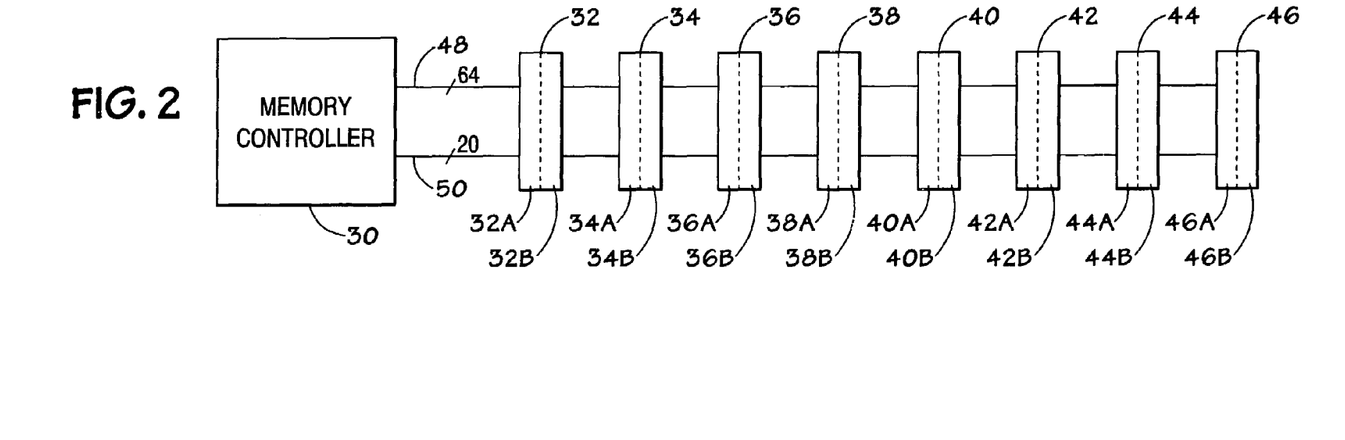
FIG. 2 illustrates an exemplary memory sub-system in accordance with embodiments of the present invention.

FIG. 2 generally illustrates a block diagram of a portion of a memory sub-system, such as the volatile memory 26. A memory controller 30 is generally provided to facilitate access to storage devices in the volatile memory. The memory controller 30 may receive requests to access the storage devices via one or more processors, such as the processor 12, via peripheral devices, such as the peripheral device 24, and/or via other systems. The memory controller 30 is generally tasked with facilitating the execution of the requests to the memory devices and coordinating the exchange of information, including configuration information, to and from the memory devices.

The memory sub-system may include a plurality of slots 32, 34, 36, 38, 40, 42, 44, and 46. Each slot 32-46 is configured to operably couple a memory module, such as a dual-inline memory module (DIMM), to the memory controller 30 via one or more memory buses. Each memory module generally includes a plurality of memory devices such as DRAM devices capable of storing data. Each memory module has a number of memory devices arranged in "ranks." Ranks traditionally include the arrangement of memory devices on each opposing side of the module. However, in accordance with present embodiments, multiple ranks may be disposed on a single side (e.g., in a stacked configuration). Accordingly, each slot 32-46 may be configured to receive a single memory module having two ranks. For instance, the slot 32 is configured to receive a memory module having ranks 32A and 32B, the slot 34 is configured to receive a DIMM having ranks 34A and 34B, and so forth. In the present exemplary embodiment, each of the eight memory slots 32-46 is capable of supporting a module comprising eight individual memory devices on each rank 32A/B-46A/B. As will be appreciated, and as describe further below, each memory module may include four or more ranks.

Referring again to FIG. 2, the memory buses may include a memory data bus 48 to facilitate the exchange of data between each memory device on the DIMMs and the memory controller 30. The memory data bus 48 may comprise a plurality of single bit data buses (e.g., DQ0-DQ63) each coupled from the memory controller 30 to a memory device. In one embodiment of the volatile memory 26, the memory data bus 48 may include 64 individual data buses. Further, the memory data bus 48 may include one or more individual buses to each memory rank 32A/B-48A/B which may be used for ECC error detection and correction. As can be appreciated by those skilled in the art, the individual buses of the memory data bus 48 will vary depending on the configuration and capabilities of the system 10.

The volatile memory 26 also includes a command bus 50 on which address information such as command address (CA), row address select (RAS), column address select (CAS), write enable (WE), bank address (BA), chip select (CS), clock enable (CKE), and on-die termination (ODT), for example, may be delivered for a corresponding request. Further, the command bus 50 may also be used to facilitate the exchange of configuration information at boot-up. As with the memory data bus 48, the command bus 50 may comprise a plurality of individual command buses. In the present embodiment, the command bus 50 may include 20 individual buses. As previously described with reference to the memory data bus 48, a variety of embodiments may be implemented for the command bus 50 depending on the system configuration.

Figure 3:
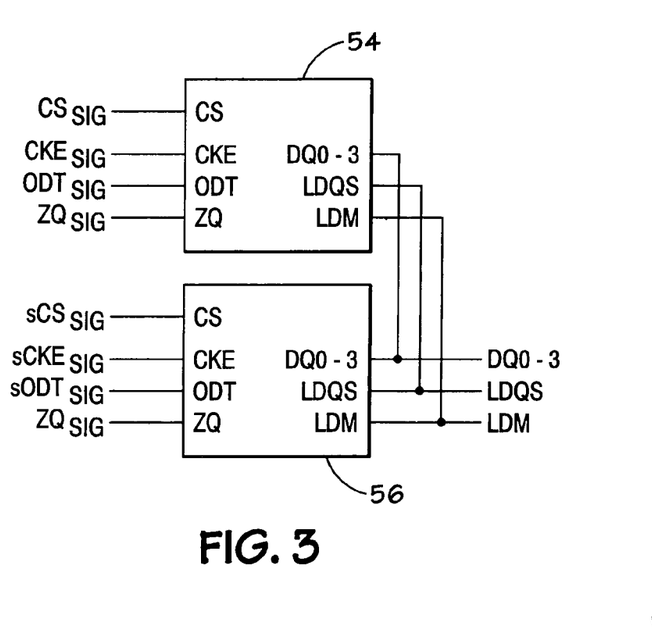
FIG. 3 is a block diagram of two ×4 memory devices arranged in two ranks of ×4 devices which may be configured in accordance with embodiments of the present invention.

FIG. 3 is a block diagram of two memory devices 54 and 56 arranged in two ranks in accordance with embodiments of the present invention. Specifically, FIG. 3 illustrates two DRAM devices which each have a "×4" (by 4) bit memory width. The DRAMs are arranged as two ranks of ×4 memory in accordance with present embodiments, which are discussed in further detail below. Each DRAM includes four data input/output pins (DQ0-3), which are configured to receive data signals, such as data signals DQ0-3$_{signal}$. Additionally, each DRAM includes a number of control input pins. In the illustrated embodiment, the control input pins include a chip select pin (CS), a clock enable pin (CKE), an on-die termination pin (ODT), and a calibration input pin (ZQ). Each of the control input pins is configured to receive a control signal, such as the control signals CS$_{signal}$, CKE$_{signal}$, ODT$_{signal}$, ZQ$_{signal}$, sCS$_{signal}$, sCKE$_{signal}$, sODT$_{signal}$, and sZQ$_{signal}$, wherein the prefix "s" refers to a stacked signal. It should be noted that each DRAM includes a lower data strobe (LDQS) and a lower data mask (LDM). It should also be noted that Vss represents power. Each of the control input pins, data input/output pins and control signals will be recognized by one of ordinary skill in the art.

Figure 4:
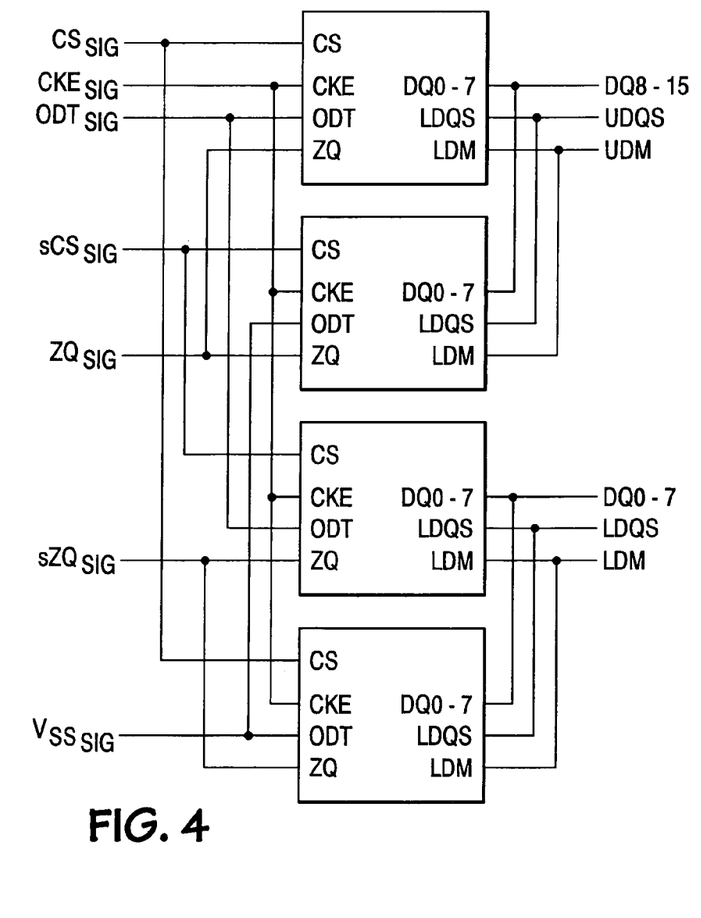
FIG. 4 illustrates four ×8 memory devices arranged in two ranks of ×16 devices which may be configured in accordance with embodiments of the present invention.
Figure 5:
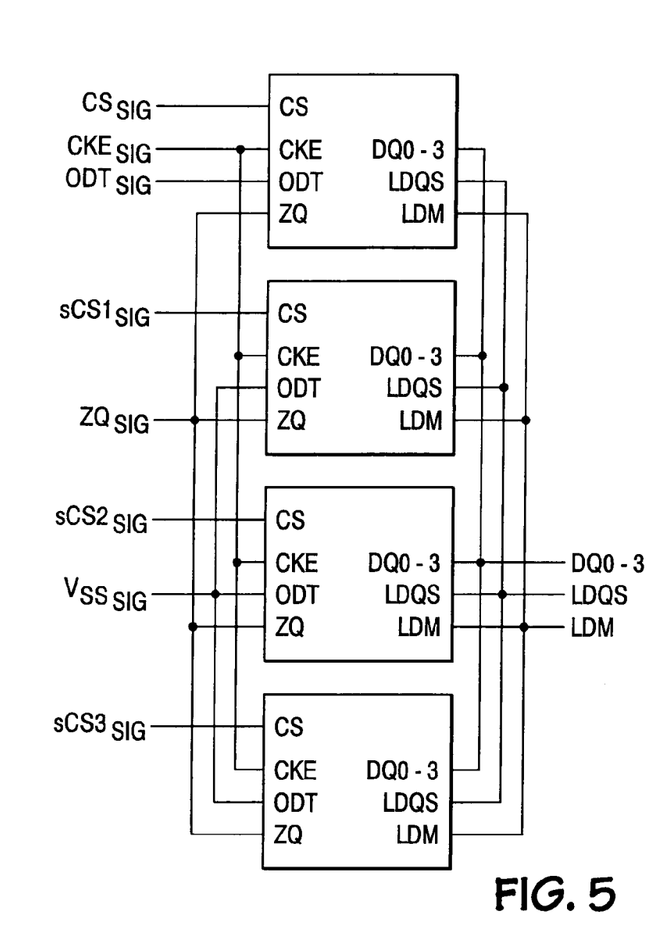
FIG. 5 illustrates four ×4 memory devices arranged in four ranks of ×4 devices which may be configured in accordance with embodiments of the present invention.
Figure 6:
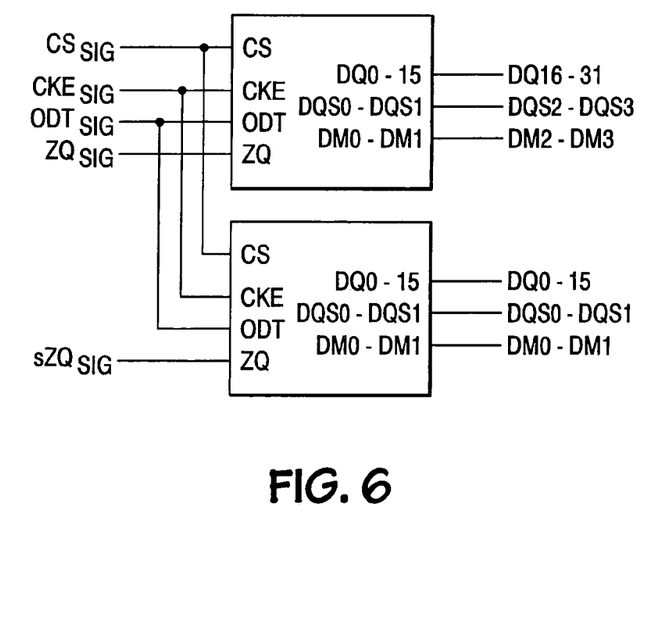
FIG. 6 illustrates a single rank of two ×16 memory devices which may be configured in accordance with embodiments of the present invention.

As set forth above, the two ×4 DRAMs in FIG. 3 are arranged as two ranks of ×4 memory. In one embodiment, these two ×4 DRAMs are disposed in a stacked orientation on a single side of a memory module. As one of ordinary skill in the art will recognize, different arrangements of memory may be utilized to increase storage, the number of available data pins, and so forth. Indeed, FIGS. 4-6 are illustrative of such embodiments. For example, FIG. 4 illustrates four ×8 memory devices (e.g., DRAMs) arranged in two ranks of ×16 bit width. The memory configuration illustrated in FIG. 4 have a greater widths than those of FIG. 3 and include additional data input/output pins (DQ0-7 and DQ8-15). FIG. 5 illustrates four ×4 devices arranged in four ranks of ×4 bit width memory, wherein additional chip select signals sCS1, sCS2, and sCS3 are employed for the additional ranks. FIG. 6 illustrates a single rank of ×32 memory built from two ×16 memory devices. The memory configuration illustrated in FIG. 6 has a greater width than that of FIG. 3 and accordingly includes additional data input/output pins (DQ0-15 and DQ16-31).

Figure 7:
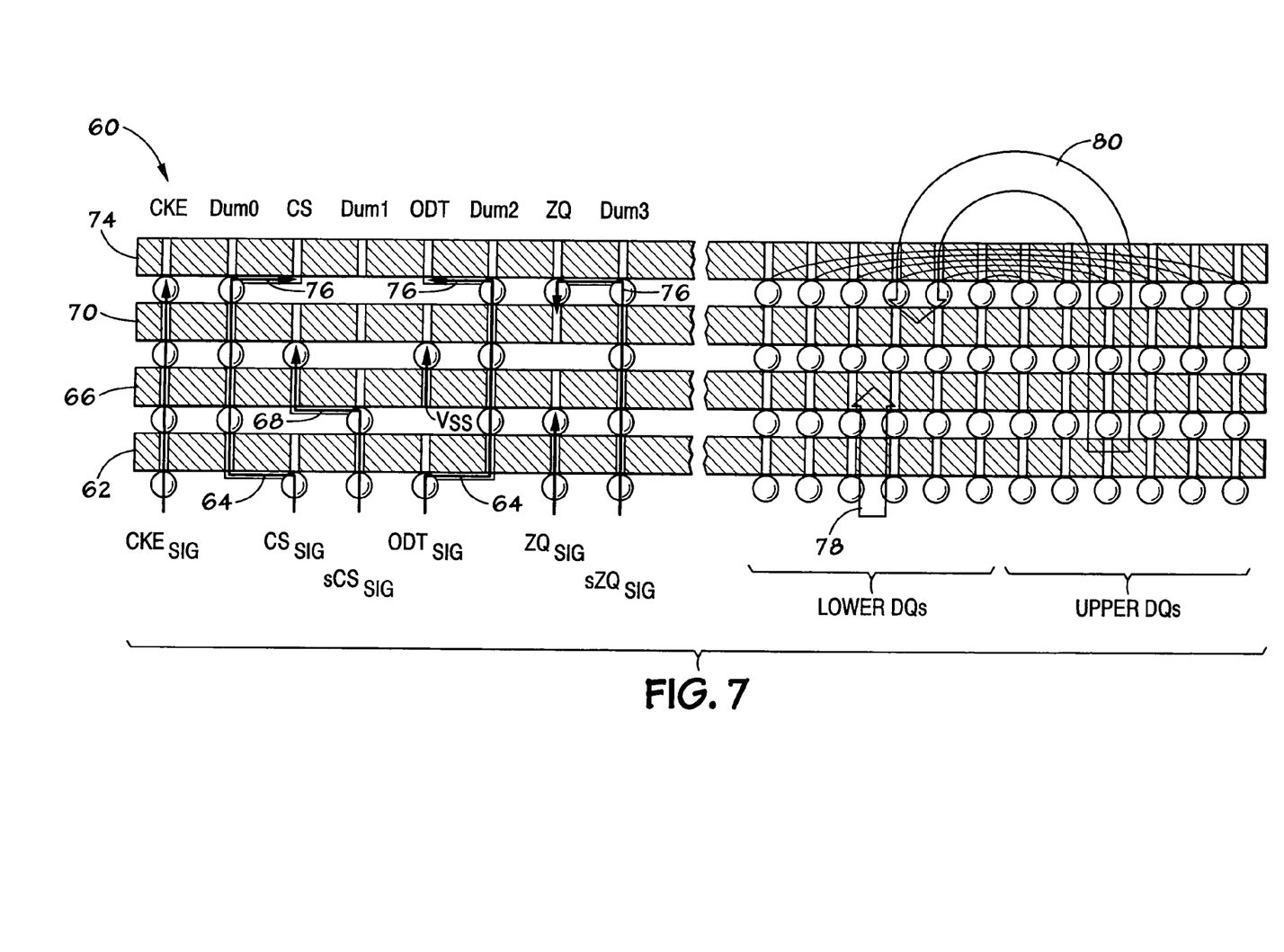
FIG. 7 is a diagrammatical view of a die stack associated with FIG. 5 and employing a number of redistribution layers.

FIG. 7 is a diagrammatical view of a die stack 60 having four die that is illustrative of issues addressed by embodiments of the present invention. Specifically, the die stack 60 includes two ranks of ×16 built from four ×8 devices. Further, the die stack 60 comprises RDLs disposed on three of the four die. Indeed, FIG. 7 illustrates a first die 62 having a first RDL 64 disposed thereon, a second die 66 having a second RDL 68 disposed thereon, a third die 70 having no RDL, and a fourth die 74 having a third RDL 76 disposed thereon. It should be noted that each die 62, 66, 70, and 74 is distinct from the others because of the different configurations of the associated RDLs 64, 68, and 76 or the lack of an RDL (die 70) disposed on each die. FIG. 7 also illustrates Lower DQs and Upper DQs along with arrows 78 and 80, which are representative of data flow.

Because the external control signals (e.g., CKE$_{signal}$, CS$_{signal}$, sCS$_{signal}$, ODT$_{signal}$, ZQ$_{signal}$, and sZQ$_{signal}$) originate from outside of the die stack 60 and enter the die stack 60 from an underlying substrate or PCB (not shown) through the bottom die 62, it is desirable to provide routing through the die stack 60 to allow the desired signals to reach the control inputs for each die. The RDLs 64, 68, and 76 operate to direct the signals to appropriate pins (e.g., CKE, Dum0, CS, Dum1, ODT, Dum2, ZQ, or Dum3) on each die. For example, the CS$_{signal}$ control signal enables the CS control input pins on the first die 62 and the fourth die 74. However, the CS pins on the second die 66 and third die 70 are enabled by the sCS$_{signal}$ control signal, rather than the CS$_{signal}$ control signal. Accordingly, the RDLs are utilized to route the CS$_{signal}$ and sCS$_{signal}$ signals to the appropriate pins. Specifically, for example, the first RDL 64 routes the CS$_{signal}$ signal from the CS pin on the first die 62 to an available pin, such as Dum0, on the first die 62. As will be appreciated, Dum0-Dum3 represent unassigned or unused pins on each die 62, 66, 70, and 74. The Dum0 pin on the first die 64 is coupled to other Dum0 pins on dies 66 and 70, thus establishing a communication route that passes through both the second die 66 and third die 70 to the RDL 76 on the fourth die 74. The RDL 76 on the fourth die 74 routes the CS$_{signal}$ signal to the CS pin on the fourth die 74, thus enabling it. While this is a simple example, one of ordinary skill in the art will recognize that the RDLs also provide similar routing through the die stack 60 to enable other control input pins with the corresponding required signals.

As noted above, providing RDLs (e.g., 64, 68, and 76) within a die stack (e.g., 60) can be beneficial because it enables communication of external signals to appropriate pins within the die stack. However, the use of RDLs can be expensive and inefficient. For example, as noted above, each of the die 62, 66, 70, and 74 are different because each requires a different RDL configuration to enable the appropriate pins throughout the die stack 60. Accordingly, separate processes, equipment, material, and procedures are required to provide each of the die configurations. This may not be desirable. Accordingly, embodiments of the present invention facilitates the provision of die that are fabricated equivalent to one another but that can be configured to meet the requirements of a particular die stack element.

Figure 8:
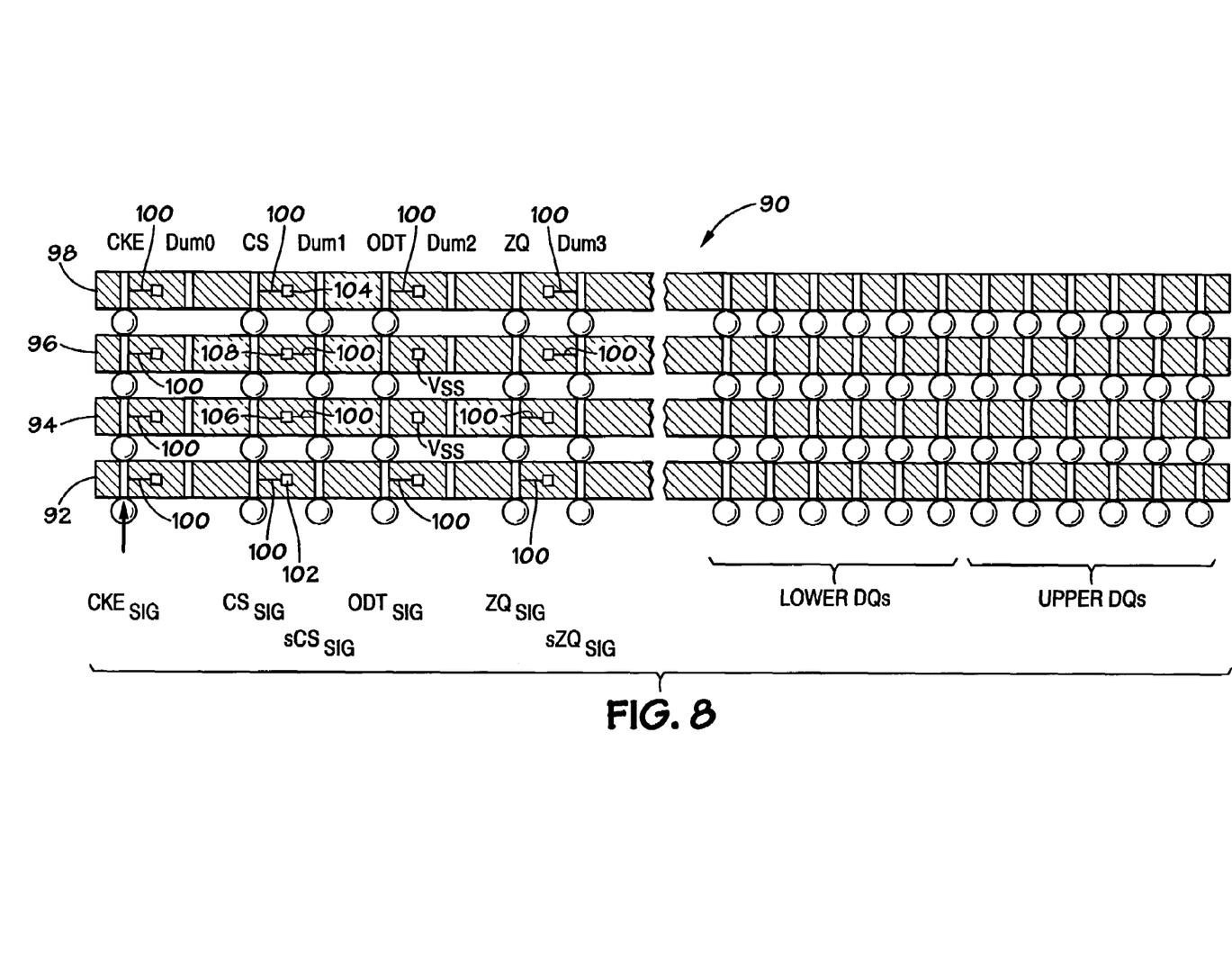
FIG. 8 is a diagrammatical view of a configurable die stack associated with FIG. 5 and formed from four die in accordance with embodiments of the present invention.

FIG. 8 is a diagrammatical view of a configurable die stack 90 formed from four die in accordance with embodiments of the present invention. Specifically, the die stack 90 includes two ranks of ×16 memory built from four ×8 devices, which include a first configurable die 92, a second configurable die 94, a third configurable die 96, and a fourth configurable die 98. The die stack 90 does not require that RDLs be disposed on any of the die to enable signal routing, as in FIG. 7. Advantageously, in accordance with embodiments of the present invention, the configurable die (i.e., 92, 94, 96, and 98) incorporate path selectors 100 (e.g., multiplexer devices) that facilitate die customization. It should be noted that each configurable die 92, 94, 96, and 98 may be initially indistinct from the others (e.g., no path selections in the die having been activated). Thus, the fabrication of each die 92, 94, 96, and 98 is essentially identical. However, in the embodiment illustrated by FIG. 8, the die 92, 94, 96, and 98 have been customized by activating the path selectors 100. Specifically, the die 92, 94, 96, and 98 have been customized to operate like the die illustrated by FIG. 7 without using RDLs. In other words, the path selectors 100 have been activated such that they function similarly to the RDLs in FIG. 7. The path selectors 100 will be described in more detail with regard to FIGS. 9-11. In the interest of providing context, it should be noted that FIG. 8 also illustrates Lower DQs and Upper DQs on each of the die.

Because the external signals (e.g., CKE$_{signal}$, CS$_{signal}$, sCS$_{signal}$, ODT$_{signal}$, ZQ$_{signal}$, and sZQ$_{signal}$) originate from outside of the configurable die stack 90 and enter the die stack 90 through the bottom die 92, it is desirable to provide routing through the die stack 90 to allow the desired signals to reach the control inputs for each die. It is also desirable to achieve this without using RDLs and without requiring that each die be uniquely manufactured. Accordingly, the illustrated embodiment includes the path selectors 100, which can be configured such that they direct the signals to appropriate pins (e.g., CKE, Dum0, CS, Dum1, ODT, Dum2, ZQ, or Dum3). For example, the $CS_{signal}$ control signal enables the CS control input pin on the first die 92 and on the fourth die 98. However, the CS pins on the second die 94 and third die 96 are enabled by the $sCS_{signal}$ control signal, not the $CS_{signal}$ control signal. Accordingly, the path selectors 100 are enabled such that they can be utilized to route the $CS_{signal}$ and $sCS_{signal}$ signals to the appropriate pins while avoiding inappropriate pins.

In the embodiment illustrated by FIG. 8, the path selectors 100 coupled between the CS pins and the Dum 1 pins of the first die 92 and fourth die 98 are configured such that they route the $CS_{signal}$ signal from the CS pins on the first and fourth dies 92 and 98 to the related circuits 102 and 104 on each die. Correspondingly, the path selectors 100 coupled between the CS pins and the Dum 1 pins of the second die 94 and third die 96 cause the $CS_{signal}$ signal to bypass the related circuits 106 and 108 on each die. It is desirable for the circuits 106 and 108 to be bypassed by the $CS_{signal}$ signal because they are enabled by the $sCS_{signal}$ signal, not the $CS_{signal}$ signal. The opposite path selector configuration is implemented for the $sCS_{signal}$ signal route. For example, the fuse 100 between the CS and Dum 1 pins of the second die 94 is burned such that the corresponding circuit receives the $sCS_{signal}$ signal rather than the $CS_{signal}$ signal, as illustrated. While this is a simple example, one of ordinary skill in the art will recognize that the path selectors 100 may also provide similar routing, as illustrated in FIG. 8 and more clearly described below, through the die stack 90 to enable other control input pins with corresponding signals.

Figure 9:
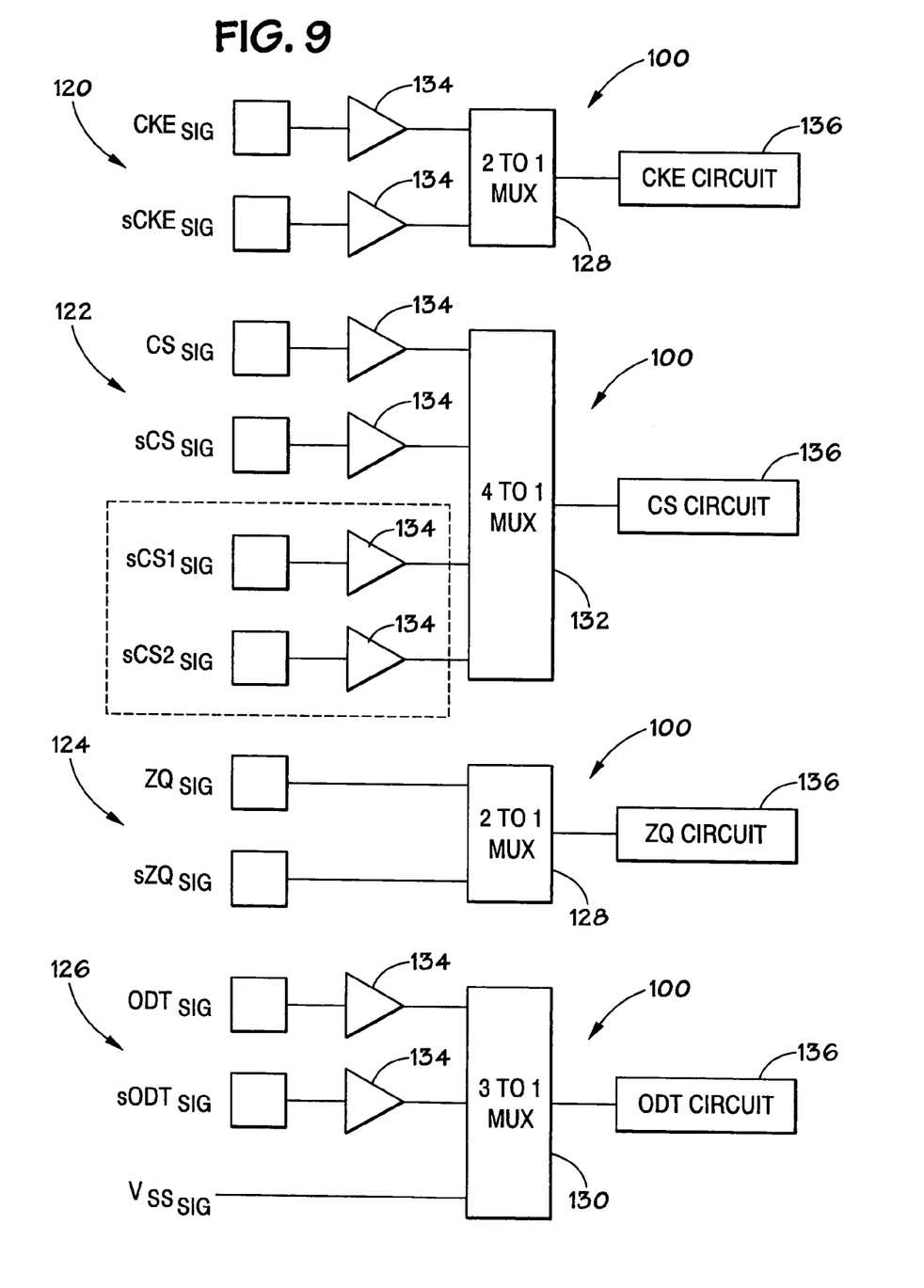
FIG. 9 is a block diagram of four path selectors in accordance with embodiments of the present invention.

FIG. 9 is a block diagram of four path selectors 100 in accordance with embodiments of the present invention. Specifically, FIG. 9 illustrates a CKE path selector 120, a CS path selector 122, a ZQ path selector 124, and an ODT path selector 126. Each of the path selectors 120, 122, 124, and 126 incorporates a multiplexer to facilitate signal path selection. For example, the CKE path selector 120 and the ZQ path selector 124 incorporate two-to-one multiplexers 128, the ODT path selector 126 incorporates a three-to-one multiplexer 130, and the CS path selector 122 incorporates a four-to-one path selector 132. It should be noted that the sCS1 and sCS2 signal inputs on the CS path selector 122 may not be utilized if the die does not support quadrank.

Figure 10:
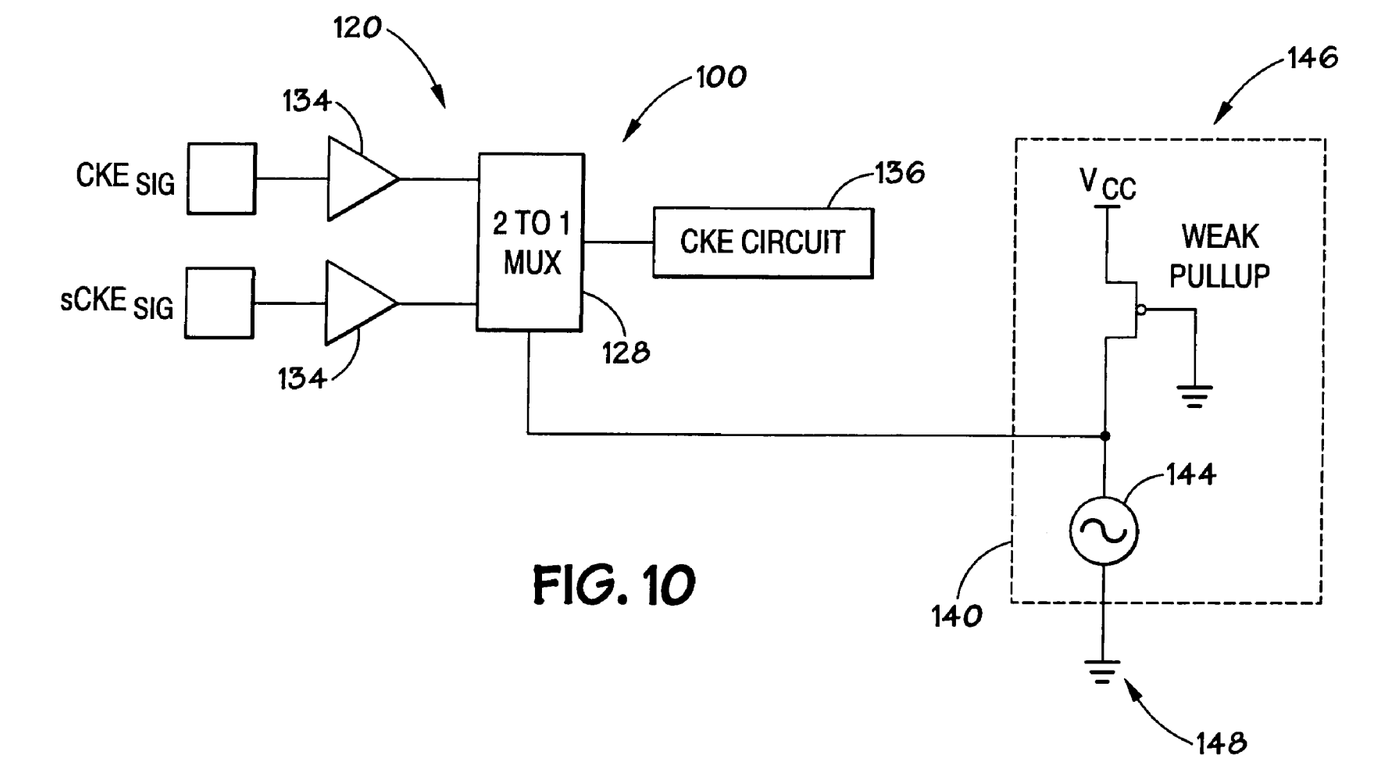
FIG. 10 is a block diagram illustrating a CKE path selector having a path selector control circuit that is fuse controlled in accordance with embodiments of the present invention.
Figure 11:
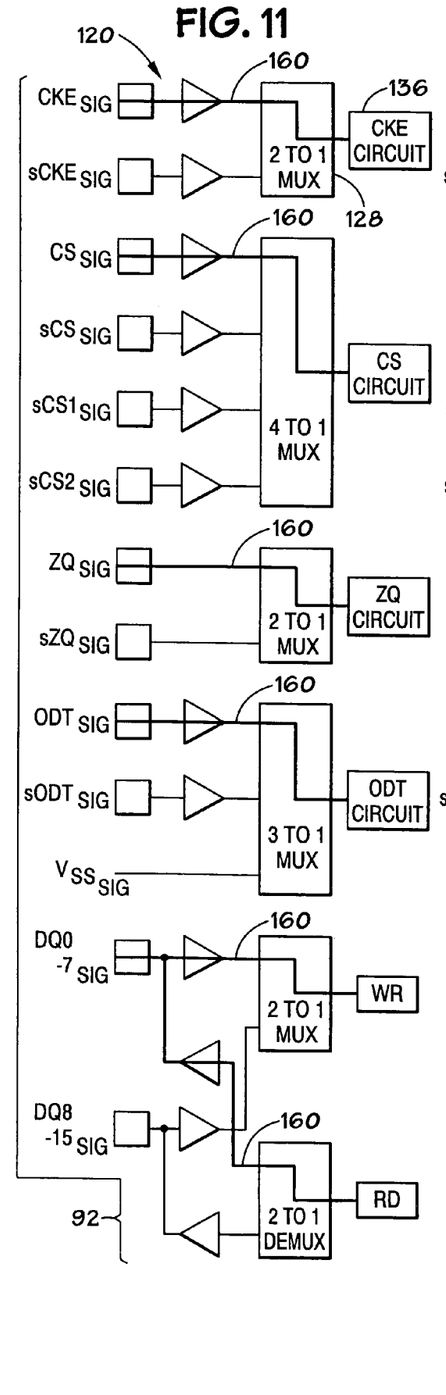
FIGS. 11-14 is a block diagram of path selectors and selected paths in each of four die in a die stack associated with FIG. 8 in accordance with embodiments of the present invention.
Figure 12:
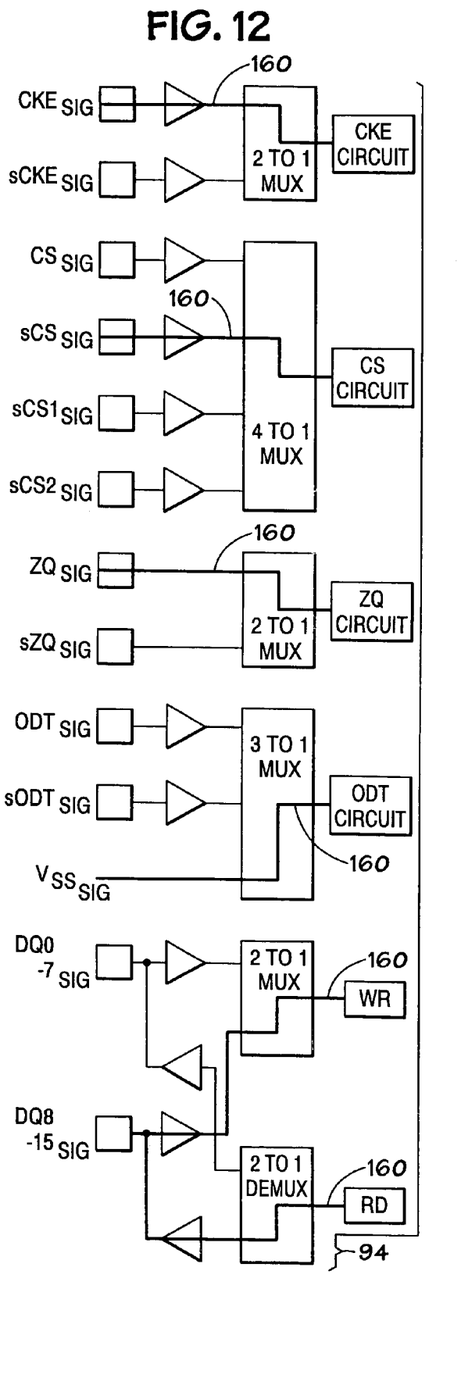
Figure 13:
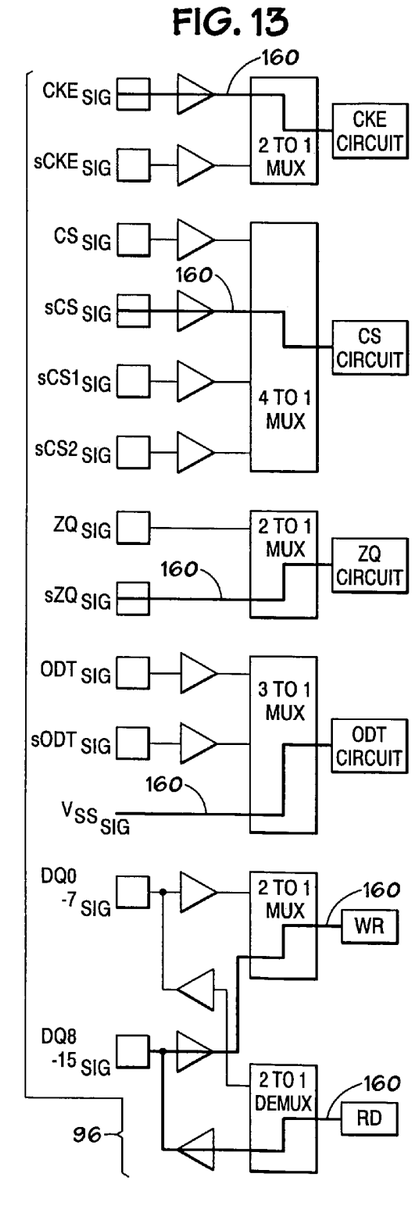
Figure 14:
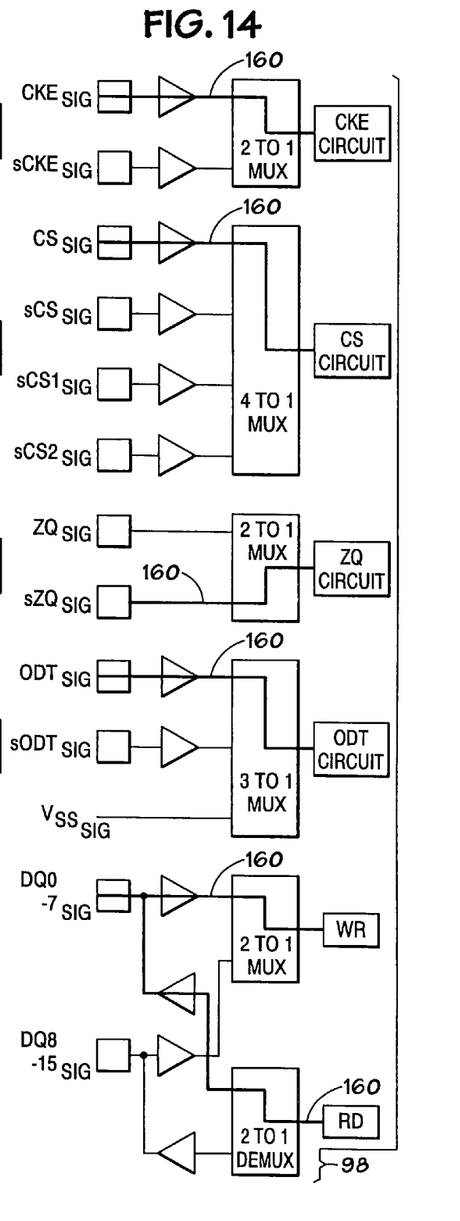

In operation, the path selectors 100 receive signals (e.g., $CKE_{signal}$ and $sCKE_{signal}$), that pass through buffers 134 (with exception to the ZQ path selector 124) and into the multiplexer (e.g., 128, 130, and 132), which designates a signal path. The selected signal then enables the corresponding circuit 136. As will be appreciated, each circuit 136 simply represents the active ICS that are associated and enabled by each of the respective control signals. The path selectors 100 may be fuse controlled (e.g., using a fuse or an antifuse) or may utilize mode register select (MRS) to implement path selection. For example, FIG. 10 is a block diagram illustrating the CKE path selector 120 having a path selector control circuit 140 that is fuse controlled. The path selector control circuit 140 provides a signal to a select input 142 of the multiplexer 128 depending on a condition of a fuse 144. The fuse 144 is either blown (open) or not blown (short) to select which signal (i.e., $CKE_{signal}$ or $sCKE_{signal}$) will pass through the multiplexer 128 and into the related circuit 136. When the fuse 144 is blown, the signal to the select input is pulled high (e.g., a value of 1) by a weak pullup transistor 146. If the fuse 144 is not blown, the signal to the select input 142 is pulled low (e.g., a value of 0) to ground 148. As one of ordinary skill in the art will recognize an antifuse may be utilized in other embodiments to achieve the same or similar functionality. Further, while a single example is illustrated by FIG. 10, other embodiments may utilize similar path selection schemes and path selector control circuits, as illustrated in FIG. 11.

FIGS. 11-14 are block diagrams of the path selectors 100 and selected paths 160 in each of the four die discussed above with respect to FIG. 8. Specifically, the columns of path selectors 100 in FIGS. 11-14 are representative of the die 92, 94, 96, and 98 in FIG. 8 respectively. For example, the CKE path selector 120 of the first die in FIG. 11 indicates that the $CKE_{signal}$ signal is passed through the multiplexer 128 and into the corresponding circuit 136 based on its path selector control circuit 140 and so forth, as described above. Additionally, FIGS. 11-14 illustrate path selectors 100 and selected paths 160 for the data input/output pins (DQ0-7 and DQ8-15). It should be noted that in the illustrated embodiment, the path selectors 100 for the data input/output pins include two-to-one demulitplexers.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device comprising:
a first die comprising:
a first circuit configured to be enabled by a first control signal;
a first input pin configured to receive the first control signal; and
a first path selector arranged between the first input pin and the first circuit and configured to select a first signal path to the first circuit from the first input pin; and
a second die comprising:
a second circuit configured to be enabled by a second control signal;
a second input pin configured to receive the second control signal; and
a second path selector arranged between the second input pin and the second circuit and configured to select a second signal path to the second circuit from the second input pin, wherein the first die and the second die form a stack such that a signal may be routed though each of the first signal path and the second signal path in a direction perpendicular to a surface of the first die and a surface of the second die, wherein the surface of the second die is disposed parallel to the surface of the first die.

2. The memory device of claim 1, wherein the first control signal is a chip select signal.

3. The memory device of claim 1, wherein the first path selector comprises a multiplexer.

4. The memory device of claim 1, comprising a path selector control circuit comprising a fuse, wherein the path selector control circuit is configured to control the first path selector.

5. The memory device of claim 4, wherein the path selector control circuit is configured to provide a high signal when the fuse is blown.

6. The memory device of claim 4, wherein the path selector control circuit is configured to provide a low signal when an antifuse is blown.

7. The memory device of claim 1, comprising memory comprising a plurality of die.

8. A memory module comprising:
   a die stack comprising a plurality of memory devices;
   a plurality of pins disposed within the plurality of memory devices, wherein each of the plurality of pins is configured to receive a signal;
   a plurality of circuits disposed within each of the plurality of memory devices; and
   a plurality of path selectors configured to selectively provide signal paths between the plurality of pins and the plurality of circuits, wherein a plurality of signals may be routed through the signal paths such that each of the plurality of signals enters the die stack from pins selected from the plurality of pins, the pins being disposed on a bottom surface of the die stack and each of the plurality of signals routing upward through the signal paths in a direction perpendicular to the bottom surface.

9. The memory module of claim 8, wherein the memory module comprises a dual inline memory module (DIMM).

10. The memory module of claim 8, wherein each of the plurality of memory devices comprises a dynamic random access memory (DRAM) device.

11. The memory module of claim 8, wherein the plurality of signals include a chip select signal, a clock enable signal, an on-die termination signal, and a calibration signal.

12. The memory module of claim 8, wherein the plurality of path selectors comprises at least one multiplexer.

13. The memory module of claim 8, wherein the plurality of path selectors comprises at least one path selector control circuit comprising a fuse or antifuse, wherein the path selector control circuit is configured to control the path selector.

14. The memory module of claim 13, wherein the path selector control circuit is configured to provide a high signal when the fuse is blown.

15. The memory module of claim 13, wherein the path selector control circuit is configured to provide a low signal when the antifuse is blown.

16. A computer system comprising:
   a processor; and
   a memory system coupled to the processor and comprising:
      a memory controller;
      a memory device comprising a die stack;
      a first circuit in a first die of the die stack and a second circuit in a second die of the die stack, wherein the first and second circuits are configured to be enabled by a control signal;
      a first input pin disposed within the first die on a bottom surface of the die stack, the first input pin configured to receive the control signal;
      a first path selector arranged between the first input pin and the first circuit and configured to select a first signal path to the first circuit from the first input pin based on the control signal; and
      a second input pin disposed within the second die in a position in-line with and above the first input pin, the second input pin configured to receive the control signal;
      a second path selector arranged between the second input pin and the second circuit and configured to select a second signal path to the second circuit from the second input pin based on the control signal such that a signal may be routed though each of the first signal path and the second signal path in a direction perpendicular to the bottom surface of the die stack.

17. The memory system of claim 16, wherein the memory device comprises a dynamic random access memory (DRAM) device.

18. The memory system of claim 16, wherein the control signal comprises a chip select signal.

19. The memory system of claim 16, wherein the control signal comprises an inverse chip select signal.

20. The memory system of claim 16, wherein the first path selector comprises a fuse controlled path selector.

21. The memory system of claim 20, wherein the fuse controlled path selector includes an antifuse.

22. A method of manufacturing memory, comprising:
   providing a plurality of memory die having a fuse controlled path selector within each of the memory die;
   enabling communication paths to circuits within each memory die based on enablement requirements of the circuits; and
   configuring the plurality of memory die in a stack to route a signal from an input pin disposed on a bottom surface of the stack though the die stack in a direction perpendicular to the bottom surface of the stack via the enabled communication paths.

23. The method of claim 22, comprising configuring the plurality of memory die in the stack without providing a redistribution layer.

24. The memory module of claim 8, wherein each of the plurality of circuits is configured to be enabled by control signals, the control signals communicatively coupling the path selectors between the plurality of pins and the plurality of circuits.

25. The memory module of claim 8, wherein the memory devices include four ×8 devices configurable as two ranks of ×16 memory stacked on a single side of the memory module.

* * * * *

UNITED STATES PATENT AND TRADEMARK OFFICE
CERTIFICATE OF CORRECTION

PATENT NO. : 7,352,602 B2  Page 1 of 1
APPLICATION NO. : 11/323530
DATED : April 1, 2008
INVENTOR(S) : Janzen It is certified that error appears in the above-identified patent and that said Letters Patent is hereby corrected as shown below:

In column 8, line 49, in Claim 1, delete "though" and insert -- through --, therefor.

In column 10, line 13, in Claim 16, delete "though" and insert -- through --, therefor.

In column 10, line 37, in Claim 22, delete "though" and insert -- through --, therefor.

Signed and Sealed this

Twenty-fourth Day of June, 2008

JON W. DUDAS
*Director of the United States Patent and Trademark Office*